(12) United States Patent
Marchidan et al.

(10) Patent No.: US 11,675,938 B2
(45) Date of Patent: Jun. 13, 2023

(54) OPTIMAL PATH PLANNING FOR DIRECTIONAL DRILLING

(71) Applicant: Nvicta LLC., Austin, TX (US)

(72) Inventors: Andrei Marchidan, Austin, TX (US);
Parham Pournazari, Austin, TX (US);
Gurtej Saini, Austin, TX (US)

(73) Assignee: Nvicta LLC., Austin, TX (US)

( * ) Notice: Subject to any disclaimer, the term of this patent is extended or adjusted under 35 U.S.C. 154(b) by 411 days.

(21) Appl. No.: 16/745,433

(22) Filed: Jan. 17, 2020

(65) Prior Publication Data

US 2020/0242286 A1 Jul. 30, 2020

Related U.S. Application Data

(60) Provisional application No. 62/796,931, filed on Jan. 25, 2019.

(51) Int. Cl.
*G06F 30/20* (2020.01)
*G06N 5/04* (2023.01)
*G06N 7/01* (2023.01)

(52) U.S. Cl.
CPC .............. *G06F 30/20* (2020.01); *G06N 5/04* (2013.01); *G06N 7/01* (2023.01)

(58) Field of Classification Search
CPC ........... G06F 30/20; G06N 5/04; G06N 7/005
USPC ...................................................... 703/10
See application file for complete search history.

(56) References Cited

U.S. PATENT DOCUMENTS

| 8,210,283 | B1* | 7/2012 | Benson ................... E21B 44/00 |
| | | | 175/45 |
| 8,596,385 | B2* | 12/2013 | Benson .................... E21B 7/10 |
| | | | 175/45 |
| 8,794,353 | B2 | 8/2014 | Benson et al. |
| 8,996,396 | B2* | 3/2015 | Benson ............ G06Q 10/06375 |
| | | | 705/400 |
| 9,297,205 | B2* | 3/2016 | Benson .................... E21B 7/10 |
| 9,702,240 | B2* | 7/2017 | Bittar .................... E21B 47/022 |
| 9,765,571 | B2* | 9/2017 | Huang .................... E21B 10/00 |

(Continued)

OTHER PUBLICATIONS

Li et al. ("Particle Filter with Novel Nonlinear Error Model for Miniature Gyroscope-Based Measurement While Drilling Navigation" MDPI, 2016, pp. 1-24) (Year: 2016).*

(Continued)

*Primary Examiner* — Iftekhar A Khan
(74) *Attorney, Agent, or Firm* — Egan, Enders & Huston LLP.

(57) ABSTRACT

A system, method and a computing architecture, for well path planning that can be used in directional drilling and provides for optimal path planning in directional drilling operations. One method includes receiving information about the planned drilling path, target-zone location and planned path changes, and real-time drill-bit location measurements. The method estimates the current state of the geometric location of the drill-bit in the earth during directional drilling operations, and the characteristics of the bottom-hole assembly before and after receiving drill bit location measurements. Such a method preferably determines a time optimal path, such as a Dubins path between the current state of the drill-bit location and the user-provided target-zone.

13 Claims, 7 Drawing Sheets

(56) References Cited

U.S. PATENT DOCUMENTS

| | | | | |
|---|---|---|---|---|
| 2012/0024606 A1* | 2/2012 | Pirovolou | ............... | G01C 21/16 703/10 |
| 2013/0032407 A1* | 2/2013 | Edbury | ................... | E21B 44/06 175/61 |
| 2015/0142406 A1* | 5/2015 | Spencer | ..................... | E21B 7/04 703/10 |
| 2016/0024847 A1* | 1/2016 | Benson | ................... | E21B 49/00 175/24 |
| 2016/0025877 A1* | 1/2016 | Ramfjord | .................. | E21B 7/04 702/6 |
| 2016/0034818 A1* | 2/2016 | Knecht | ................... | G06F 30/00 166/308.1 |
| 2016/0298392 A1* | 10/2016 | Gajji | ....................... | E21B 7/067 |
| 2016/0305188 A1* | 10/2016 | Hay | ........................ | E21B 21/10 |
| 2016/0313735 A1* | 10/2016 | Berkemeier | ......... | A47L 11/4072 |
| 2016/0341027 A1* | 11/2016 | Kyllingstad | .............. | E21B 7/06 |
| 2017/0202131 A1* | 7/2017 | Bunderson | ............ | B60W 10/04 |
| 2017/0308091 A1* | 10/2017 | Bunderson | ........... | G05D 1/0217 |
| 2018/0148998 A1* | 5/2018 | Spencer | ................. | E21B 47/18 |
| 2019/0048702 A1* | 2/2019 | Vorhoff | ................... | E21B 49/00 |
| 2019/0085680 A1* | 3/2019 | Maus | .................... | E21B 47/024 |
| 2019/0292898 A1* | 9/2019 | Quattrone | ............... | E21B 44/04 |
| 2019/0345771 A1* | 11/2019 | Zalluhoglu | ......... | E21B 41/0092 |
| 2019/0390969 A1* | 12/2019 | Lermusiaux | ......... | G01C 21/203 |
| 2020/0011167 A1* | 1/2020 | Zhao | ...................... | E21B 44/00 |
| 2020/0319368 A1* | 10/2020 | Bhardwaj | ............... | E21B 7/046 |
| 2021/0189860 A1* | 6/2021 | Bhardwaj | ............... | E21B 47/04 |

OTHER PUBLICATIONS

Yardimci et al. ("Shortest path optimization of haul road design in underground mines using an evolutionary algorithm" Elsevier B.V., 2019, pp. 1-18) (Year: 2019).*

Farah Omar Farah ("Directional Well Design, Trajectory and Survey Calculations, With a Case Study in Fiale, Asal Rift, Djibouti",2013, United Nations University,, pp. 625-658) (Year: 2013).*

Manyam et al. ("Shortest Dubins Path to a Circle", 2018, arXiv, pp. 1-7) (Year: 2018).*

* cited by examiner

OPTIMAL PATH PLANNING FOR DIRECTIONAL DRILLING

This application claims priority to Provisional Patent Application No. 62/796,931 filed Jan. 25, 2019, the disclosure of which is expressly incorporated herein by reference

BACKGROUND

During the wellbore construction process, there are operations, specifically geo-steering operations with a bent housing motor assembly or with a rotary steerable system, during which the trajectory of the wellbore is purposefully deviated from straight. The desired wellbore path is chosen beforehand by a team of geologists, geophysicists, reservoir engineers and drilling engineers, to access a target zone. During drilling operations, the objective of the directional driller is to follow the well-plan and to land the well in the target zone. Closely following the well-plan is essential in maintaining the quality of the wellbore for completions, as well as maximizing the production of hydrocarbons. To steer the direction of the wellbore, directional drillers rely on survey information to know where the position of the drill-bit is. If the position has deviated from the well-plan, directional drillers decide on the corrective action sequences and appropriate control parameters that will result in the convergence of the actual drilling path to the well-plan. This is often performed by relying on simple geometric calculations and past personal experience.

In recent years, several commercial and academic solutions have been proposed that automate the decision-making process of correcting the trajectory of a wellbore. Simple automation of trigonometric calculations, geometric parametrizations of well-plan trajectories, neural networks with particle swarm optimization, minimum energy criterion optimization, or genetic algorithms are some of the studied methodologies for the generation of correction paths and wellbore trajectories in directional drilling. Most of these methods, such as those listed in PCT/IB2013/060922, U.S. Pat. Nos. 9,297,205, 8,996,396, 8,794,353, 8,596,385 and 8,210,283 (incorporated by reference) rely on analyzing several possible sets of paths that result in correction of the drilling trajectory, and suggest a proposed path based on a predetermined criterion or "cost function." While these methods can potentially provide corrective solutions that consider several criteria for optimality, there are three main shortcomings that limit their practical usability and performance:

1. Trial-and-error and brute force methods attempt to evaluate the cost of hundreds, or thousands of different paths and waypoints, which can become computationally intensive and slow in practice, especially when constant re-calculation of the path is necessary.
2. The suggested path by brute force methods does not guarantee drillability. Therefore, the suggested path could result in several small set of sliding operations, if the steering device is a bent sub with a downhole motor.
3. The uncertainty in the position of the drill-bit is not considered. As such, the suggested path could after all not be optimal or even feasible if the true position of the bit is different than the estimated position by the algorithm.

SUMMARY OF THE INVENTION

The object of the present invention is to provide a system and method of optimal well path planning that can be used for directional drilling. Optimality may refer to different costs, some of which may be associated to the time required to reach desired target zones and time spent in those respective zones. In a broad form, one method for optimal path planning in directional drilling operations in accordance with the present invention involves receiving information about the planned drilling path, target-zone location and planned path changes, and real-time drill-bit location measurements. The method includes estimating the current state of the geometric location of the drill-bit in the earth during directional drilling operations, and the characteristics of the bottom-hole assembly before and after receiving said drill-bit location measurements. Using the current state of the drill-bit location and the user-provided target-zone or a node within the target-zone, the method determines a time optimal path. In a preferred form, the time optimal path is a Dubins path between the current state of the drill-bit location and the user-provided target-zone.

The time optimal path is based, at least in part on current state of the drill-bit location, BHA characteristics, different target node costs and maximum allowable path curvature. The time optimal path is checked using, at least in part, the uncertainty in the estimate of the current state of the drill-bit location, and using said current state geometric location estimate.

It is therefore an object of this invention to provide a system, method and a computing architecture, for well path planning that can be used in directional drilling. The wellbore is modeled as a drill-bit system with a predefined bound on the curvature. The path planner of a preferred embodiment relies on a known approach, called Dubins path planning, for finding optimal paths between two state configurations in a given three-dimensional space. While there are other techniques for finding the optimal path, such as particle swarm optimization and genetic algorithms used on different parametrizations of potential well-plan paths, the Dubins path planning technique provides a computationally efficient approach for a system of this nature. As the research literature and theory suggests, the time-optimal path for a system with prescribed initial and final path tangents and bounded curvature is the shortest path among four types of paths, which may be described by three types of maneuvers: slide left, slide right, and rotate, in the planned operation plane. The four types of paths are given by the following sequences of maneuvers: slide right, rotate, slide right, abbreviated RSR; slide right, rotate, slide left, abbreviated RSL; slide left, rotate, slide right, abbreviated LSR; and lastly, slide left, rotate, slide left, abbreviated LSL.

It is a further object of this invention to provide an approach for computing these optimal paths. The approach uses geometric techniques to determine a set of five non-linear equations, which describe two circles of radius determined by the system build/turn rate bound and a common tangent between these two circles in three-dimensional space. Due to numerical precision errors that may appear in solving the system of nonlinear equations, the system is normalized with respect to the distance between the initial and final position. Furthermore, the system is solved using a nonlinear solver with constraints on some of the output variables. The output variables, in this case, are two turning angles, for the first and last slide maneuver, and a unit vector describing the tangent line between the two circles. In essence, these outputs determine the lengths and directions of drill-bit slide and rotation.

It is another object of some embodiments of the present invention to provide a system, method and a computing architecture, for optimal path planning between an initial state and a target zone, that can be used in directional drilling. In a preferred embodiment the user may supply a target zone which is used in generating a discrete map of nodes associated with different sample final states, uniformly or non-uniformly. Node granularity is selected proportionally to the distance between the current position and the target region. As such, coarser maps are used when planning longer paths and finer maps are used when planning shorter paths. Granularity has a direct impact on both performance and computational time and may be adjusted by the user to accommodate the trade-off between application time and optimality.

The set of discrete nodes is then used in the creation of a cost map, where each node is associated with a specific cost that is computed from a plurality of factors. The costs may include but may not be limited to the following subset of costs: total path length, so as to choose the shortest path between the current position and the target zone; rotation length, so as to minimize deviation errors that may appear in inaccurate sliding; distance from the desired target path, defined as the path that is equidistant from the boundaries of the target zone; path robustness, defined based on a statistical distribution of the current state. Each cost is obtained by using the previously described method for optimal path planning between two different states and computing the optimal path between the initial state and the given node state. In the end, the cost of each node will be used to identify states that will be considered for generating the optimal path.

To devise a reliable statistical distribution of the current state to evaluate path robustness, it is an objective of the present invention to provide a method for systematically aggregating predictions of the current state, obtained from any kinematic model of the drilling process, with noise-corrupted sensor measurements and process uncertainty associated with unmodeled drilling dynamics which can be represented by a random walk or similar stochastic processes. A preferred embodiment of the present invention provides such a system in the form of a recursive Bayesian estimator, which also enables real-time system identification of the drilling environment, including but not limited to the building and turning characteristics of the bottom-hole assembly.

Another object of some embodiments of the present invention is to provide the user a means of overriding the choice of an optimal state from a target zone and select a different target state by inputting its coordinates and an acceptable error radius used for analyzing path variance. This allows the path planner to avoid analyzing the entire cost map and provide only detailed information (path cost data, referring to the feasibility of the planned path) for the current path joining the current state with the user defined state. If path variance exceeds a specific threshold, the user is alerted and encouraged for a state change.

It is another object of some embodiments of the present invention to provide a system, method and a computing architecture, for optimal path planning between multiple waypoints provided by the user. This method relies on the previous method for generating optimal paths between two consecutive states. Multiple waypoints can be provided by the user and the system will generate optimal paths that will connect these waypoints. Restrictions in the form of acceptable deviation radii around waypoints may be applied to generate smoother paths, by allowing the system to automatically select the waypoint state in such a way that will lead to a shorter path between the initial and final waypoint.

DETAILED DESCRIPTION OF THE INVENTION

Embodiments of the present invention will be described using the drawings presented herein. The drawings illustrate the various embodiments of a system, method and computing architecture for optimal well path planning that can be used in directional drilling, and other related embodiments Like reference numbers are designated to various elements that are part of the same system, method and/or computing architecture. The figures are not necessarily drawn to scale, and in some instances have been exaggerated and/or simplified for illustrative purposes only.

In the following descriptions, the term "state" is used to define the current position and orientation of the drill-bit. The term "orientation" refers to the drill-bit inclination and azimuth angles of the drill-bit. The term "curvature" refers to the current dogleg severity which characterizes the wellbore path. The term "granularity" refers to the distance between discretization samples. As such, high granularity determines samples with small distance between each other, while low granularity corresponds to samples with large distance between each other. The term "Dubins path" refers to the shortest path with constrained curvature between two points in Euclidean space which have prescribed initial and terminal tangents to the path. The term "inflection point" refers to a point on a path at which the curvature changes. One such point is represented by the intersection point between a circle and one of its tangent lines. The term "true vertical depth" refers to the depth of the drill-bit measured vertically with respect to a point of reference on the surface. The term "vertical section" refers to the horizontal distance from the centerline of the wellbore to a well path position. The acronym "BHA" stands for bottom-hole assembly. The term toolface refers to the radial orientation of the drill-bit with respect to the axis of the wellbore.

Figure 1:
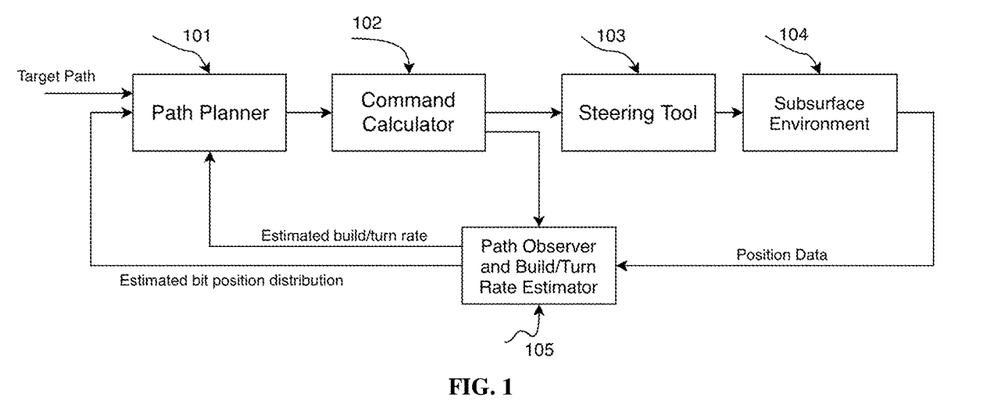
FIG. 1 illustrates a flow chart of different embodiments of a method that may be used for optimal well path planning in directional drilling.

Referring to the drawing of FIG. 1, an overall architecture of the path planning system, including the three main components, the Path Planner 101, the Command Calculator 102, and the Path Observer 105, is presented. To design a trajectory from the initial state to the desired state, the Path Planner requires information regarding the desired target path (or changes to the planned path) as well as the current instantaneous position of the drill-bit. In addition, the Path Planner needs knowledge of the likely turning ability of the steering tool (build/turn rate). All this information is provided by the Path Observer 105. To calculate estimates of the drill-bit position and build/turn rates, the Path Observer 105 relies on a kinematic model of the directional drilling process 104, as well as sensor measurements that come in the various forms, including but not limited to directional surveys through measurement-while-drilling. The Path Observer 105 models the build/turn rate dynamics using a random walk model and learns these parameters from actual data throughout the drilling process. Upon receiving the target zone location data, and estimates of the current drill-bit position, the Path Planner 101 analyzes a grid of possible waypoints and determines a time-optimal path into the target zone. While calculating the time-optimal path, the system takes into account the uncertainty in the current drill-bit position estimate (as provided by the Path Observer 105) to ensure that the suggested time-optimal path satisfies operational constraints in the case of minor discrepancies between estimated and actual current position. The role of the Command Calculator 102 is to convert the geometric data of the time-optimal path into control command suggestions for the Steering Tool 103. Commonly, for a downhole mud motor and bent sub system, these instructions come in the form of a sequence of slide/rotate commands, as well as the duration of each command and the desired toolface. In the case that the Steering Tool 103 is a rotary steerable system, these instructions come in the form of a sequence of geometric coordinates.

Figure 2:
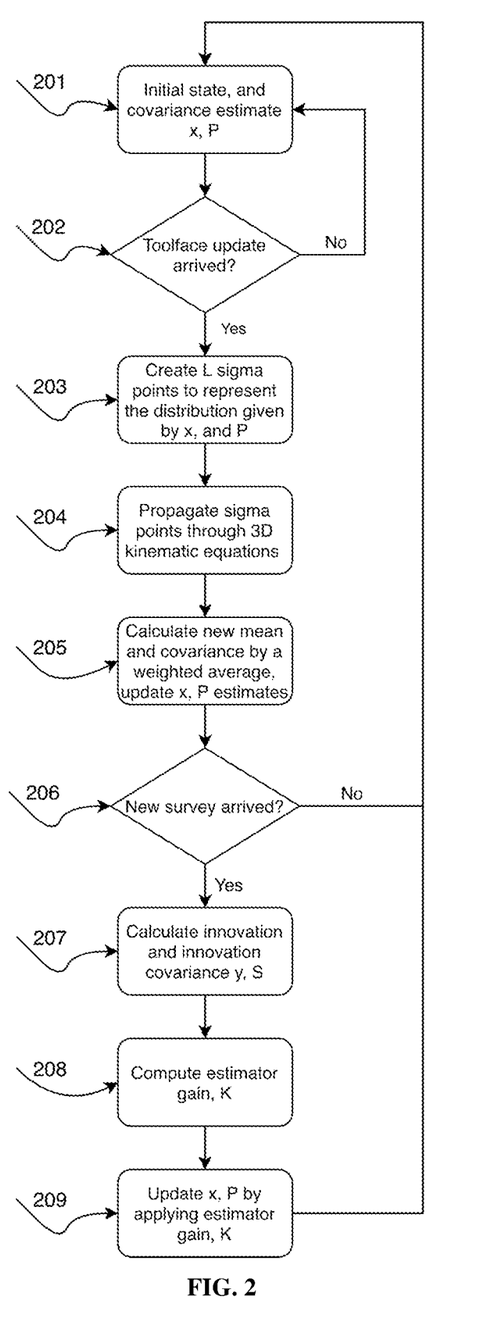
FIG. 2 illustrates a flow chart of different embodiments of a method that may be used to generate estimates for the geometric location of the drill-bit and for the bottom-hole assembly characteristics.

FIG. 2 provides a flowchart of the path estimation procedure through recursive Bayesian estimation. The path estimation procedure begins with an initial guess of the state and of the covariance matrix 201, where the state vector is given by: x=[B, T, $\theta$, $\varphi$, x, y, z] where B, T are the building and turning tendencies of the bottom-hole assembly respectively, $\theta$ is the inclination angle, $\varphi$ is the azimuth angle, and x, y, z represent the cartesian coordinates of the drill-bit. Upon receiving a new toolface update, 202, the path estimation procedure performs a prediction by creating a set of sigma points to represent the initial statistical distribution of the state, 203, and propagating these sigma points through the nonlinear kinematic equations, 204. The new predicted mean and covariance of the state can then be calculated by performing a weighted average using all the propagated sigma points, 205. In between surveys, where measurements of inclination and azimuth angles are not available, the estimated mean of the state can be used for decision making. If a survey is taken, the predictions can be updated by calculating the innovation and innovation covariance 207, and computing an optimal Kalman gain, 208. Performing the update step of the algorithm allows for real-time learning of the building and turning tendencies of the BHA from the actual survey measurements, 209.

Figure 3:
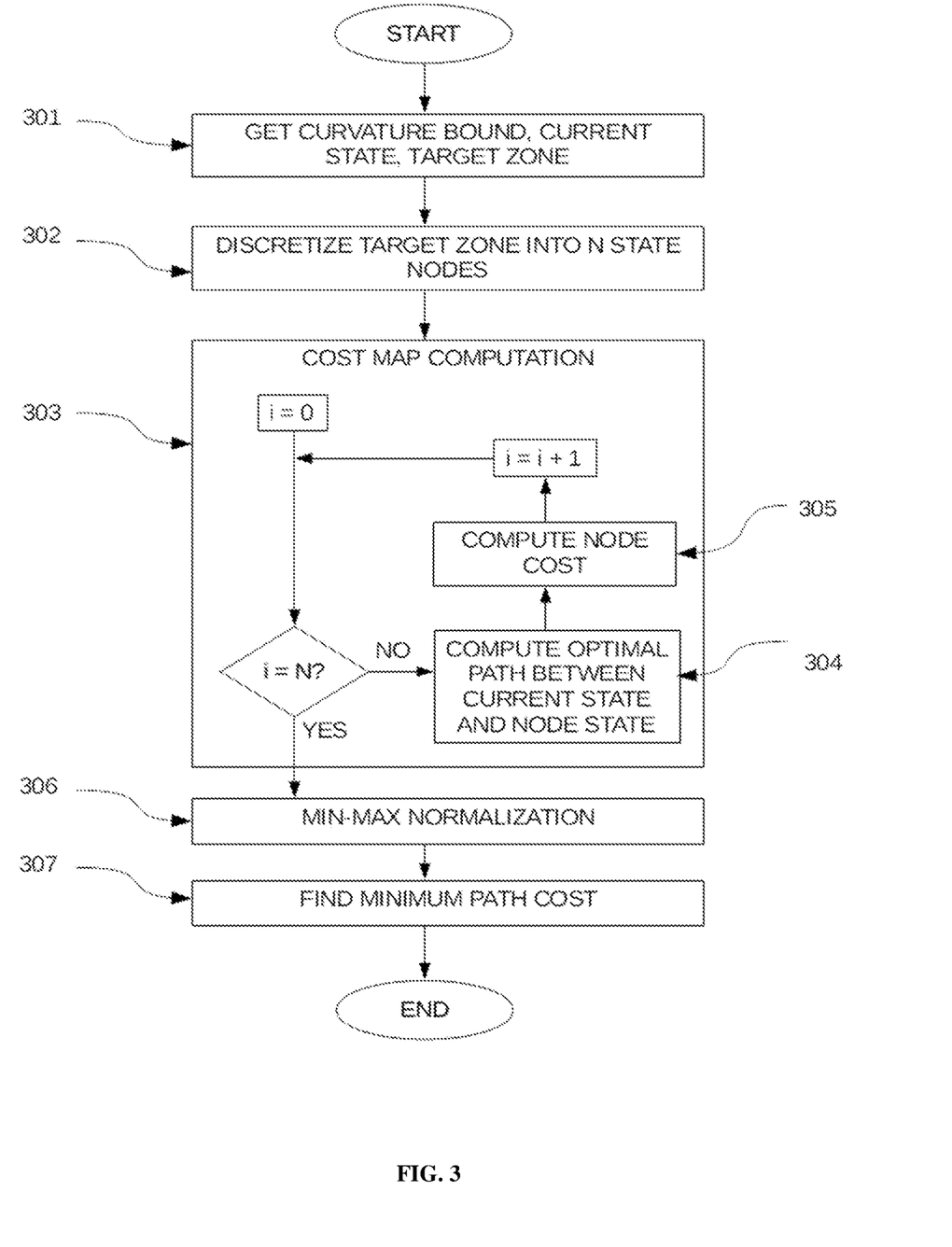
FIG. 3 illustrates a flow chart of different embodiments of a method that may be used with the method of FIG. 1 to determine an optimal corrective path between a state and a target region.

Referring now to the drawing of FIG. 3, a flowchart of a method of optimal path planning between a state and a target zone, which may be used as part of the Path Planner 101 of FIG. 1, is illustrated. The initial conditions of the drill-bit may be obtained from the method of FIG. 2 which provides the current state estimate of the drill-bit and estimated BHA characteristics, or from user inputs, along with the allowed curvature and the desired target zone for oil well path, 301.

Figure 7:
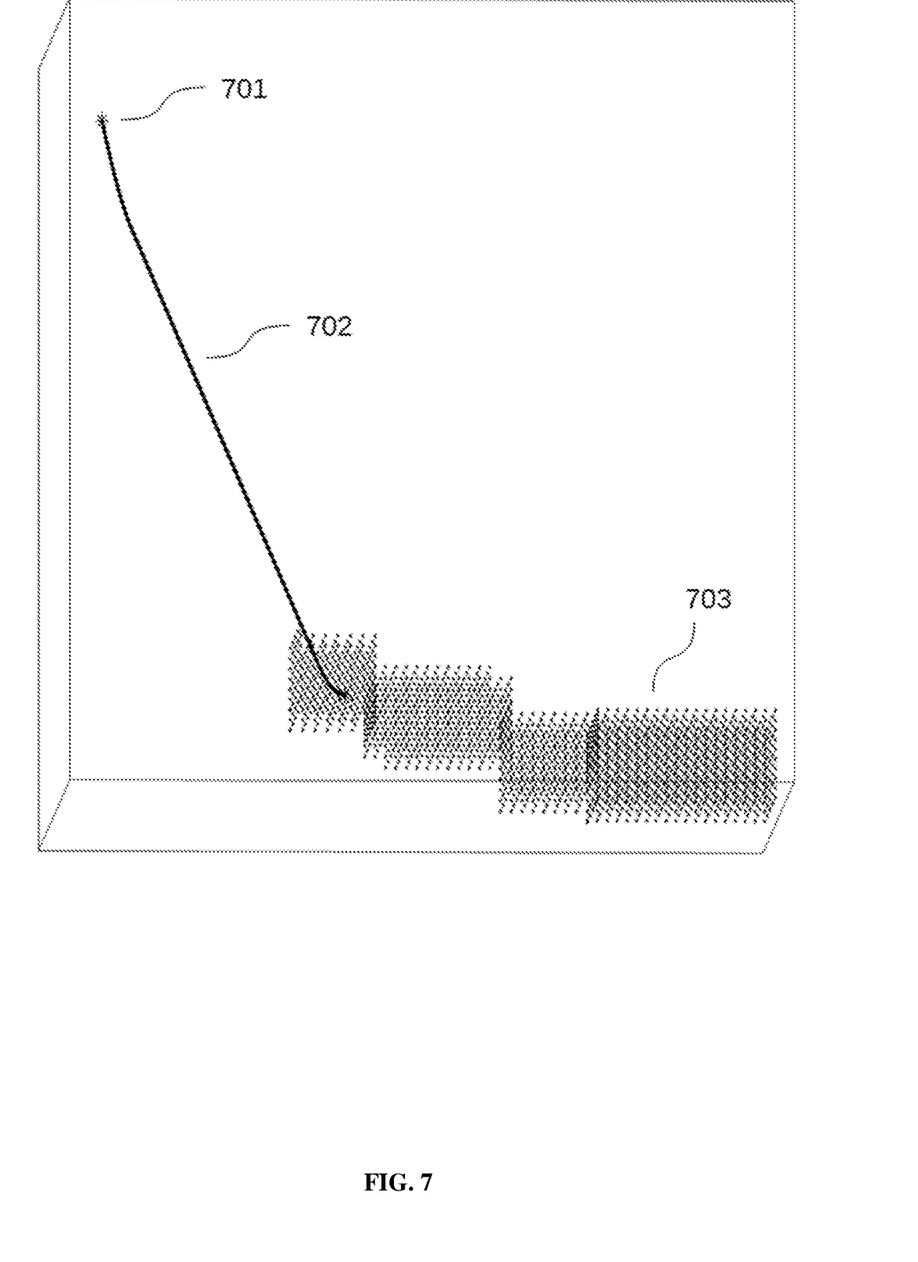
FIG. 7 illustrates embodiments of a three-dimensional Dubins path that is the result of the computational method of FIG. 3.

The target zone, which can be provided as a set of vertices, is then discretized into N possible state nodes, 302. Each state node describes the target position and orientation that the drill-bit should achieve if the path plan is accurately followed. The discretization procedure may be performed uniformly or non-uniformly, depending on the user preference. Discretization granularity may be chosen by the user or may be determined as a function of the largest distance between the current drill-bit position and the target zone. Therefore, the target zone may be discretized with a high granularity if the drill-bit is close to the target zone or with a low granularity, otherwise. Discretization samples are taken around the given desired states with a predefined tolerance. For example, one target zone may be obtained by considering the desired target well-path with a 10 ft tolerance in both true vertical depth and departure from the desired vertical plane, leading to a box-shaped target zone, as illustrated in 702.

In the next step of the method of FIG. 3, corresponding to one of the invention embodiments, 305, each node is associated with a specific cost that captures the amount of penalty for moving the drill-bit from its current state to that respective node state. This is encapsulated in the cost map computation, 303. The cost associated with a node may be generated from, but may not be limited to, the following factors:

a) total length of the optimal path,
b) length of rotation,
c) distance from the desired path,
d) and path robustness.

Figure 4:
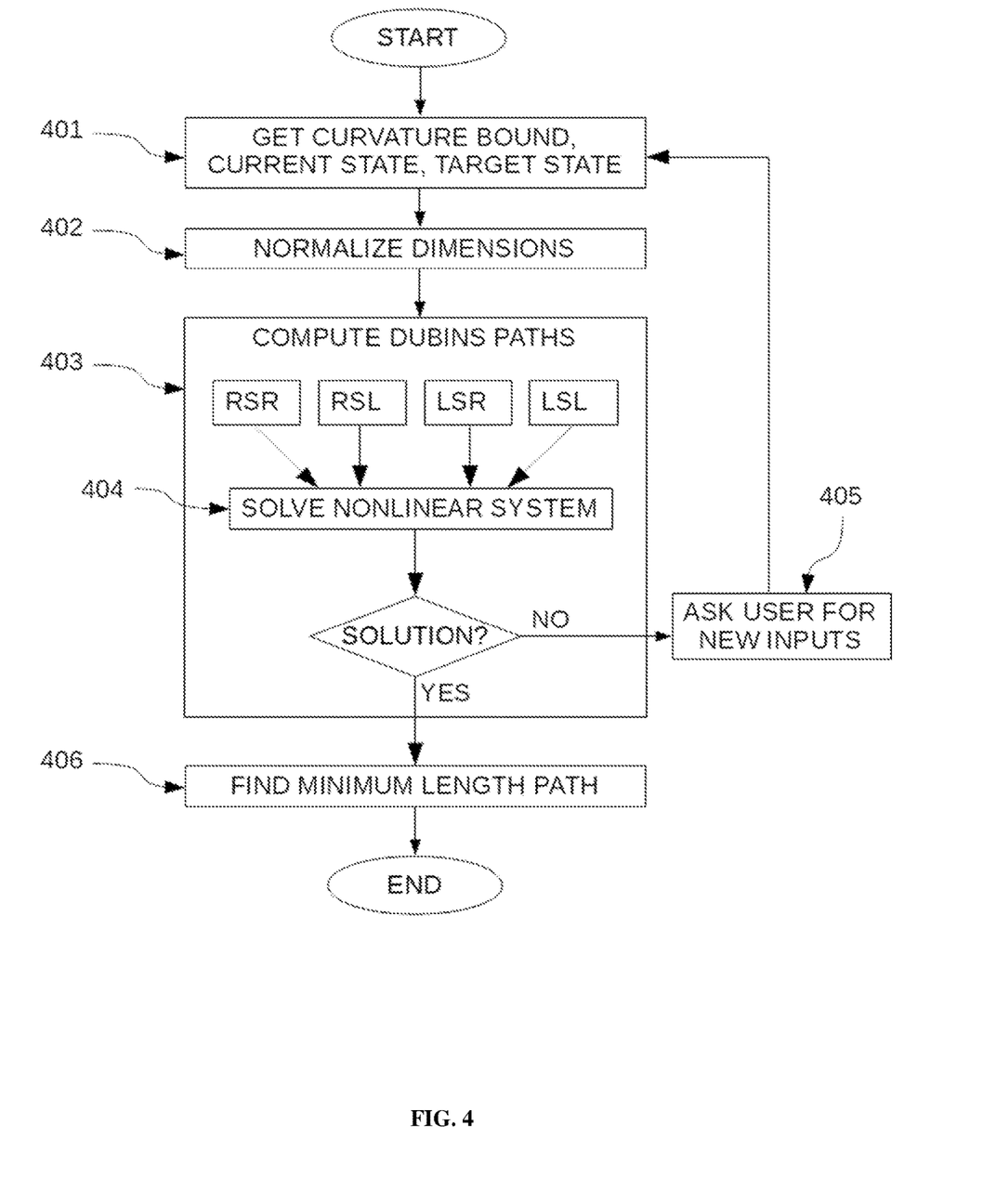
FIG. 4 illustrates a flow chart of different embodiments of a method that may be used with the method of FIG. 3 to determine an optimal path between two different states.

Each of the mentioned factors has a direct impact on system performance and operation costs. The optimal path length is directly related to the time required to reach the specific node state. Therefore, minimizing the total length minimizes the operation time and cost. Rotating tends to hold the drill-bit direction and is usually faster to perform than steering or sliding, being less susceptible to path deviation errors. Thus, maximizing the duration of the rotation maneuver makes the system more accurate. The third factor considered for penalizing the nodes of the cost map is the distance from the desired path. Given a target zone, the desired path is the path that passes through the target zone while being equidistant from the target zone boundaries. As such, choosing a target node that is closer to the desired path will maximize oil well coverage since the well path will be more likely to pass through the target zone if it is directed to pass through its center rather than its boundaries. Lastly, path robustness is considered as another penalty factor and is determined by applying the method described in FIG. 5. These factors can be considered only after the optimal path between the current state and the node state is computed, 304. Thus, the method of FIG. 4 is used to compute the Dubins path between these states.

In a preferred embodiment of this invention the cost map values are normalized, 306. This is performed using a standard min-max normalization or feature scaling, where the cost values are reduced to a 0-1 range, in accordance to the following formula:

$$\frac{x - \min(x)}{\max(x) - \min(x)},$$

where x is the cost considered to be normalized, min(x) and max(x) are the minimum and maximum values of this cost over all nodes, respectively. Using the normalized costs, a simple search algorithm is implemented, 307, to find the minimum cost node. Then, the minimum cost path is found between the current state and the target zone.

FIG. 4 is a flowchart of a method of path planning between a current state and a target state, in accordance with a preferred embodiment of this invention. This method may be called as a stand-alone procedure or as part of different algorithms, such as the ones illustrated in FIGS. 3 and 5. A curvature bound, current state and target state are picked, 401, either by the user or by the procedure calling algorithm, such as 304 or 505. Since dimensions may vary depending on the application, they are normalized using the same feature scaling mentioned in 306. Then, according to some research on optimal control and path planning, the optimal path between two states in three-dimensional space can be found among four candidate paths. The four candidate paths are described by three maneuvers, each one representing either a straight segment, corresponding to drill-bit rotation abbreviated by S, or a curved segment that may be categorized as a "right turn", abbreviated by R, or a "left turn", abbreviated by L, depending on the drill-bit sliding direction. Using these abbreviations, a path may be referred to be of a specific type defined by the different segment categories. For example, a path that turns left, then right and continues to move straight, may be called a path of type LRS. Furthermore, it is known that the four candidate paths for the optimal path are described by the following sets of segments or path types: RSR, RSL, LSR, LSL.

Figure 6:
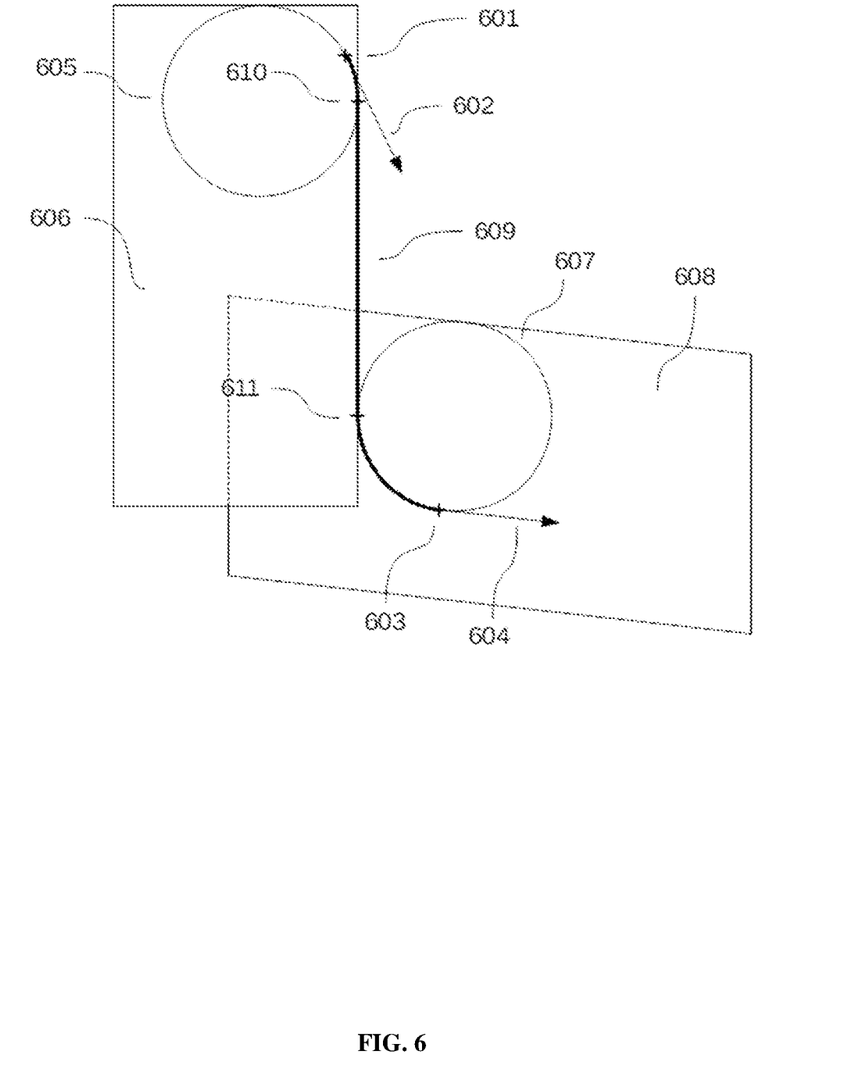
FIG. 6 illustrates embodiments of a three-dimensional Dubins path that is the result of the computational method of FIG. 4.

Next, it is an object of a preferred embodiment of this invention to determine these four candidate paths, 403. FIG. 6 illustrates one such candidate path, specifically of type RSL, between an initial state, with position 601 and orientation 602, and a final state, with position 603 and orientation 604. The paths are determined by finding the line, 609, that is tangent to two circles: one which is tangent to the initial state, 605, in plane 606, and one which is tangent to the final state, 607, in plane 608. As such, a system of five nonlinear equations relating the two circles, the position of the inflection points, 610 and 611, and the unit vector describing the direction of the tangent line, 609, can be solved to determine all the required geometric features to construct the Dubins path. The solution to the set of five nonlinear equations can be found using any nonlinear equation solver, 604. If the solver outputs a solution, then we find the minimum length path by computing the lengths of each segment of the path and choosing the shortest path among the four candidates, 606. If the solver is unable to find a solution, then the planning conditions may not be appropriate, and the user is asked for new inputs, 605.

Figure 5:
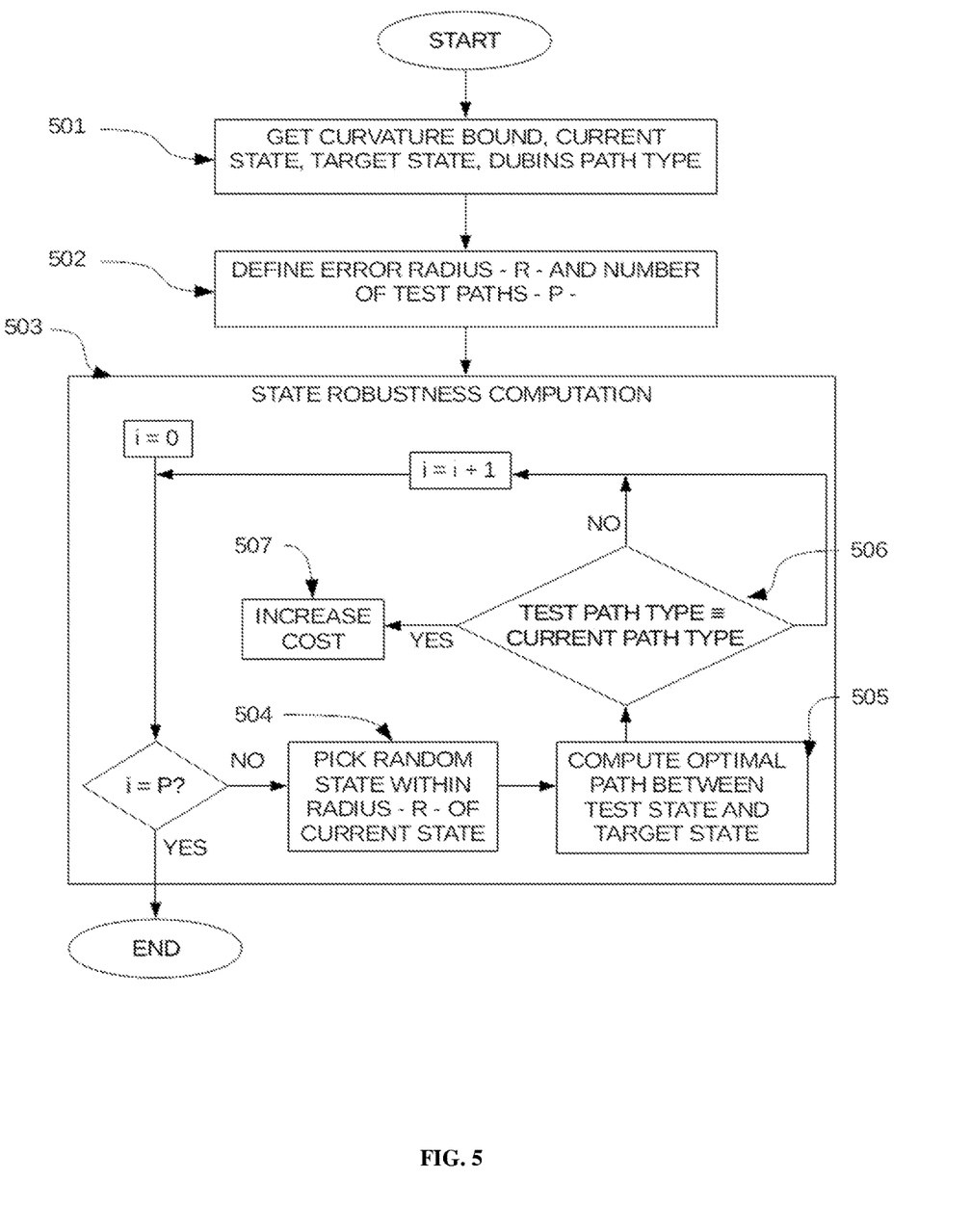
FIG. 5 illustrates a flow chart of different embodiments of a method that may be used with the method of FIG. 3 to determine the associated robustness cost of a node state.

Referring now to the drawing of FIG. 5, a flowchart of a method for determining the robustness cost of a path is illustrated, in accordance with a preferred embodiment of this invention. Path robustness cost may be defined as the variance of a path type in the presence of current state position errors. As such, the cost can be the number of paths that are of different type than the desired Dubins path type for that estimated current state. The computation of such a cost may be achieved by applying the method presented in FIG. 5. This method may be called as a stand-alone procedure or as part of different algorithms, such as the one illustrated in FIG. 3. A curvature bound, current state, target state and desired Dubins path type are picked, 501, either by the user or by the procedure calling algorithm, such as 305. An error radius, R, defined by the user or by the estimator of FIG. 2, and a number of test paths, P, defined by the user, 502, are used in the state robustness computation, 503. Thus, for each candidate test path, a test state, with a position within radius R of the current drill-bit position and with the same orientation as the current state, is randomly picked, 504. The optimal path between the test state and the target state is computed, 505, using the method of FIG. 4. If the optimal test path has the same path type with the desired Dubins path type, then it is considered that the target state is robust, and the cost is left the same. Otherwise, the cost is increased, and the procedure is repeated by picking a new random state and checking its path type, until the number of test paths has been reached.

FIG. 7 shows the results of the method presented in FIG. 3. It is one embodiment of this invention that the current state is specified, and its illustration is given in 701. Furthermore, the target zone is discretized into N state nodes, illustrated in 703. The minimum cost node between this current state and this target zone is obtained by applying the presented algorithm and may be illustrated as in 702.

What is claimed is:

1. A method for optimal path planning in directional drilling operations, the method comprising:
receiving information about the planned drilling path and target-zone location,
and measurements of the location and orientation, including inclination and azimuth, of a drill-bit in the earth during directional drilling operations, and
estimating the location and orientation of the drill-bit and directional tendencies of the bottom-hole assembly before and after receiving said drill-bit location measurements;
determining a time-optimal path between the estimated drill-bit location and the target-zone location, subject to user defined-constraints including maximum allowable path curvature and distance outside target-zone location, including discretizing the target-zone location and planned drilling path into several discretized nodes; and
steering said drill-bit in the earth approximately along said time-optimal path.

2. The method of claim 1, wherein the orientation includes inclination and azimuth and the drill-bit location estimate includes measured depth, easting, northing and true vertical depth.

3. The method of claim 1, wherein the drill-bit location measurements includes measured depth.

4. The method of claim 1, said estimating the location of the drill-bit and directional tendencies of the bottom-hole assembly step includes a recursive Bayesian inference technique, where a predictive distribution is obtained by propagating a priori distribution through a kinematic model of the drilling path and correcting the predictive distribution after a set of measurements have arrived.

5. The method of claim 1, said target-zone location including several discretized nodes, said determining a time-optimal path step, includes determining a Dubins path between the drill-bit location and discretized nodes in the target-zone location, including determining the four candidate Dubins paths including RSR, RSL, LSR, LSL, through solving a set of 5 nonlinear equations to determine the tangent line orientation between the circles representing the turns and the inflection point locations; and selecting the shortest path amongst the four candidate paths.

6. The method of claim 5, said determining a time-optimal path step includes sorting the Dubins paths based on time-to-complete and selecting the fastest path subject to the user-defined constraints.

7. A drilling system comprising: a drill string and a bottom hole assembly at one end of the drilling string for operation in a bore hole and a computer system operatively coupled to said drilling string, said computer system comprising at least one processor and at least one memory unit, wherein the at least one memory unit is coupled to the at least one processor and configured to store a plurality of instructions executable by the at least one processor, the instructions including instructions for:
  (i) Identifying a planned drilling path from a bottom hole assembly (BHA) location to a target-zone for said bore hole;
  (ii) Estimating the location and orientation, including inclination and azimuth of the drill-bit in the bore hole during directional drilling operations;
  (iii) Determining a time-optimal path between the of the drill-bit location and the target-zone, including discretizing the target-zone location and planned drilling path into several discretized nodes,
whereby said BHA is steered during directional drilling operations using said time-optimal path.

8. The system of claim 7, said estimating the building and turning tendencies and location of the drill-bit step includes a recursive Bayesian inference technique, where a predictive distribution is obtained by propagating a priori distribution through a kinematic model of the drilling path and correcting the predictive distribution after a set of measurements have arrived.

9. The system of claim 7, said target-zone location including several discretized nodes, said determining a time-optimal path step, includes determining a Dubins path between the drill-bit location and discretized nodes in the target-zone location, including determining the four candidate Dubins paths including RSR, RSL, LSR, LSL, through solving a set of 5 nonlinear equations to determine the tangent line orientation between the circles representing the turns and the inflection point locations; and selecting the shortest path amongst the four candidate paths.

10. A computer-implemented method to steer a downhole drilling assembly, the method comprising:
  drilling a wellbore along a planned drilling path from a bottom hole assembly (BHA) location to a target-zone for a bore hole using the drilling assembly;
  receiving data indicative of the current state of the location and orientation including inclination and azimuth of the drill-bit in the earth during said drilling;
  determining a time-optimal path between the drill-bit location and the target-zone, including the BHA characteristics, different target node costs and maximum allowable path curvature and including discretizing the target-zone location and planned drilling path into several discretized nodes; and
  checking said determined time-optimal path, including the uncertainty in the estimate of the drill-bit location, and using said location and orientation estimate.

11. The method of claim 10, said determining a time-optimal path step, includes determining a Dubins path between the drill-bit location and discretized nodes in the target-zone location, including determining the four candidate Dubins paths including RSR, RSL, LSR, LSL, through solving a set of 5 nonlinear equations to determine the tangent line orientation between the circles representing the turns and the inflection point locations; and selecting the shortest path amongst the four candidate paths.

12. The method of claim 10, wherein the orientation includes inclination and azimuth and the drill-bit location estimate includes measured depth, easting, northing and true vertical depth.

13. The method of claim 10, said estimating the location of the drill-bit and directional tendencies of the bottom-hole assembly step includes a recursive Bayesian inference technique, where a predictive distribution is obtained by propagating a priori distribution through a kinematic model of the drilling path and correcting the predictive distribution after a set of measurements have arrived.

\* \* \* \* \*